(12) United States Patent
Chiu

(10) Patent No.: US 6,840,794 B2
(45) Date of Patent: Jan. 11, 2005

(54) APPARATUS AND METHODS FOR COOLING A PROCESSOR SOCKET

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/403,648

(22) Filed: Mar. 31, 2003

(65) Prior Publication Data

US 2004/0192104 A1 Sep. 30, 2004

(51) Int. Cl.⁷ .......................... H01R 4/60; H01R 13/00
(52) U.S. Cl. ...................... 439/485; 439/198; 439/487
(58) Field of Search ............................... 439/196–198, 439/342, 485–487

(56) References Cited

U.S. PATENT DOCUMENTS

| | | | | |
|---|---|---|---|---|
| 3,989,331 A | * | 11/1976 | Hanlon | 439/70 |
| 4,638,348 A | * | 1/1987 | Brown et al. | 257/700 |
| 4,820,976 A | * | 4/1989 | Brown | 324/760 |
| 5,083,194 A | * | 1/1992 | Bartilson | 257/722 |
| 5,562,462 A | * | 10/1996 | Matsuba et al. | 439/70 |
| 5,578,870 A | * | 11/1996 | Farnsworth et al. | 257/727 |
| 6,128,188 A | * | 10/2000 | Hanners | 361/694 |
| 6,357,023 B1 | * | 3/2002 | Co et al. | 714/42 |
| 6,514,103 B2 | * | 2/2003 | Pape et al. | 439/608 |

FOREIGN PATENT DOCUMENTS

JP    2000-294965    * 10/2000

* cited by examiner

*Primary Examiner*—Michael C. Zarroli
(74) *Attorney, Agent, or Firm*—Schwegman, Lundberg, Woessner & Kluth, P.A.

(57) ABSTRACT

Contact pin temperature of a semiconductor package is reduced by forcing air into a region between a circuit board and a socket body. A sealant around the perimeter of the socket body at least in part seals the socket body with the circuit board, allowing the forced gas to flow through cavities containing the contacts, thereby cooling the contacts and the package pins. The contact-pin temperature may be reduced, allowing power pins to carry more current. Accordingly, microprocessors and processing systems may be operated at higher data rates without reducing reliability or increasing contact-pin oxidation.

22 Claims, 3 Drawing Sheets

APPARATUS AND METHODS FOR COOLING A PROCESSOR SOCKET

TECHNICAL FIELD

The subject matter pertains to sockets for semiconductor packages and, in some embodiments, to air cooling sockets for high-power processors.

BACKGROUND

Semiconductor systems and, in particular, processors and processing systems continue to operate at increasingly faster data rates, leading to higher and higher current consumption levels. Current flows to a semiconductor package from a circuit board through package pins and associated contacts in a socket. Higher current levels lead to higher contact-pin temperatures due to the electrical resistance in the contacts and package pins. Higher contact-pin temperatures may result in reduced reliability and may accelerate oxidation of the contacts and pins. Because the socket body is typically a thermal insulator, such as a plastic, the heat dissipation ability of the contacts and pins is severely limited.

Conventional methods use natural convection to help cool a semiconductor package. Natural convection, however, is unable to effectively cool the contacts and pins because sufficient air flow is typically unavailable. This is especially true for power pins and their associated contacts, which carry significantly higher amounts of current. Some other conventional methods use forced-air convection to cool a semiconductor package. The forced air flows around the semiconductor package and socket, helping to cool the package pins and contacts. Forced-air convection, however, is also unable to effectively cool the contacts and package pins of these higher current packages, because sufficient air flow is unavailable near or at the contacts and pins.

Thus, there is a general need for improved socket-board-package apparatus and methods for cooling contacts and package pins. There is also a need for socket-board-package assemblies and for methods that help reduce the temperature of contacts and package pins. There is also a need for socket-board-package assemblies and for methods suitable for semiconductor packages that include processors and processing systems operating at high-current levels. There is also a need for socket-board-package assemblies and methods with improved reliability and reduced contact-pin oxidation.

BRIEF DESCRIPTION OF THE DRAWING

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents.

The subject matter provides, among other things, apparatus and methods that may help reduce contact-pin temperature of a high-current semiconductor package by forcing air into a region between a circuit board and a socket body. In embodiments, a sealant around the perimeter of the socket body may seal the socket body with the circuit board, allowing forced air to flow through contact-cavities to cool the contacts and the package pins. The contact-pin temperature may be reduced, allowing power pins to carry more current. Accordingly, the temperature of contacts and pins may be reduced, improving reliability. Semiconductor packages may be able to operate at higher current consumption levels, allowing processors and processing systems to operate at higher data rates. Reduced contact pin oxidation may also be achieved.

Figure 1:
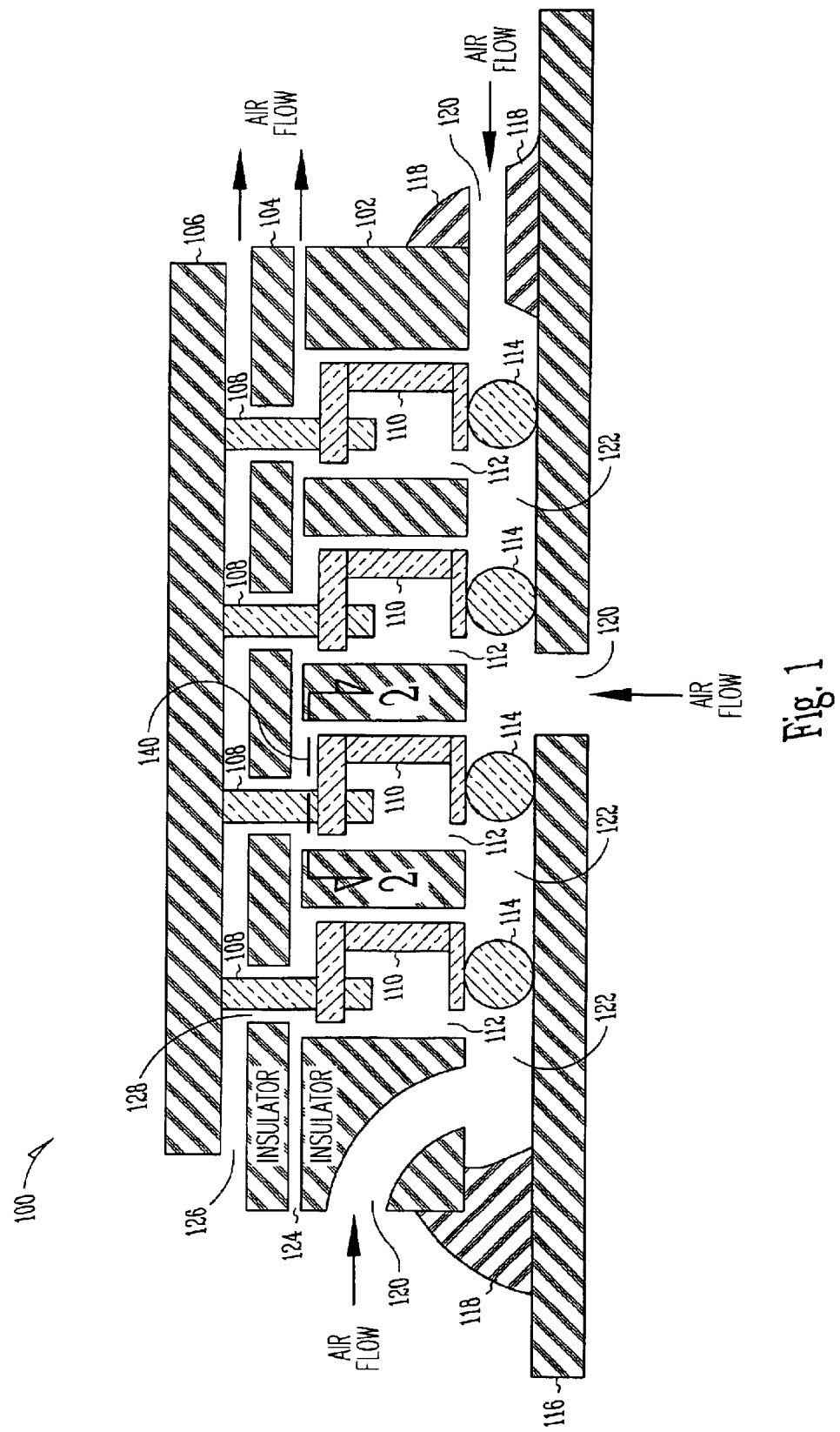
FIG. 1 is a cross-sectional view of a socket-board-package assembly in accordance with embodiments of the present invention.
Figure 2:
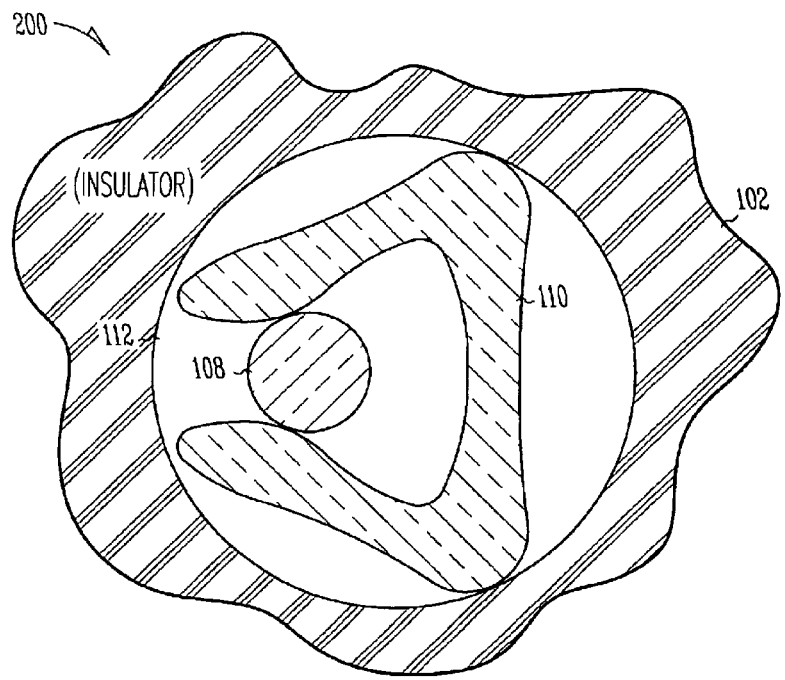
FIG. 2 is a top view of a portion of a socket body of FIG. 1 and of a cross-section of a pin taken along line 140 of FIG. 1 in accordance with embodiments of the present invention.

FIG. 1 is a cross-sectional view of a socket-board-package assembly 100 in accordance with embodiments of the present invention. FIG. 2 is a top view of a portion 200 of a socket body 102 of FIG. 1 and of a cross-section of a pin 108 taken along line 140 of FIG. 1 in accordance with embodiments of the present invention. Assembly 100 may illustrate the coupling of a semiconductor package substrate 106 to a circuit board 116. Assembly 100 includes socket body 102 and associated socket actuator 104. Socket body 102 may have a plurality of cavities 112 to contain contacts 110. Assembly 100 may also include package substrate 106 having a plurality of package pins 108 which couple with contacts 10. Pins 108 may be in a pin-grid-array. Actuator 104 may be used to actuate (e.g. slide) pins 108 of package substrate 106 so that pins 108 effectively couple with contacts 110, as illustrated in FIG. 2. Referring again to FIG. 1, in embodiments of the present invention, contacts 110 may be electrically coupled with conductive paths (not shown) of circuit board 116 through solder balls 114, although other surface-mounting techniques are also suitable. In embodiments, solder balls may be in a ball-grid-array.

In embodiments of the present invention, assembly 100 includes sealant 118, which may be dispensed around a perimeter of socket body 102, sealing a region 122 between socket body 102 and circuit board 116. Although, in the embodiment shown in FIG. 1, the sealant 118 is dispensed around the perimeter of socket body 102, in other embodiments the sealant 118 may be dispensed in any other suitable geometric arrangement, such as one or more individual areas on a surface of socket body 102.

Assembly 100 may also include one or more air inlets 120, which may be located in circuit board 116, sealant 118, and/or socket body 102 as illustrated in FIG. 1. Except for the one or more air inlets 120 and cavities 112, sealing region 122 may be a closed or sealed chamber between circuit board 116 and socket body 102 having air or some other gas therein.

In embodiments of the present invention, a gas, such as air, forced into one or more of air inlets 120 flows through cavities 112 helping to reduce the temperature of contacts 110 and pins 108. The forced gas may flow out of gap 124 between actuator 104 and socket body 102. The forced gas may also flow out of gap 126 between actuator 104 and package substrate 106 by flowing through actuator cavities 128 to help further cool package pins 108. In some embodiments, the temperature of the contacts 110 and package pins 108 may be reduced to or maintained at approximately 100 degrees Celsius or even lower.

In some embodiments, the location of a gas inlet may be selected to provide gas to flow over contacts that couple to power pins of package substrate 106. For example, when the package substrate 106 includes a microprocessor or processing system, several of pins 108 may be power pins and may carry up to one amp or more current. In these embodiments, significant heat may be generated by current flowing through the power pins and associated contacts. In these and other embodiments, the location of a gas inlet may be selected to be relatively close to the power pins. In some cases, this selected location may be closer to the center of the semiconductor package substrate 106. In some embodiments, the power pins and associated contacts may have at least 300 milliamps of current flowing during operation.

In embodiments, when gas inlet 120 is located in circuit board 116, the gas inlet 120 may be fabricated in the circuit board 116 prior to surface-mounting the socket body 102 on the circuit board 116. In other embodiments, when a gas inlet 120 is located in socket body 102, the gas inlet 120 may be fabricated prior to surface-mounting the socket body 102 on the circuit board 116. In this embodiment, the gas inlet 120 may be molded into socket body 102, or may be laser-drilled into socket body 102. In other embodiments, for example when a gas inlet 120 is located in sealant 118, the gas inlet 120 may be fabricated during dispensing of the sealant 118.

In embodiments, contacts 110 and package pins 108 may be of any suitable conductive material, such as copper or a copper-plated material, gold or a gold-plated material, a solder or tin-plated material, or BeCu (Beryllium Copper). In embodiments, socket body 102 and socket actuator 104 may be any suitable electrically-insulating material and may be a plastic material. Sealant 118 may be any suitable sealant including an epoxy. Examples of suitable epoxies include high temperature and high thermally conductive epoxies including, for example, OMEGABOND® epoxy. The gas forced into the one or more gas inlets 120 may be any suitable gas including air, nitrogen, carbon-dioxide, an inert gas including helium, and combinations thereof.

The term "suitable", as used herein, means having characteristics that are sufficient to produce the desired result(s). Suitability for the intended purpose can be determined by one of ordinary skill in the art using only routine experimentation.

Although assembly 100 is illustrated for simplicity as having only four package pins 108 with associated contacts 110 and cavities 112, embodiments of the present invention are equally suitable to assemblies with tens, hundreds or even thousands of package pins 108 with associated contacts 110 and cavities 112. In these embodiments, more than one gas inlet 120 may be located in circuit board 116 beneath socket body 102 to provide a more uniform cooling of the pins 108 and contacts 110. In some embodiments, the location of the gas inlets may be selected to particularly cool high-current power pins and their associated contacts.

Circuit board 116 may be any suitable circuit board or substrate and may be a multi-layer printed circuit board or substrate. In some embodiments, circuit board 116 may be a motherboard, while in other embodiments circuit board 116 may be an interface or interposer substrate that may couple with a larger circuit board or a motherboard.

Figure 3:
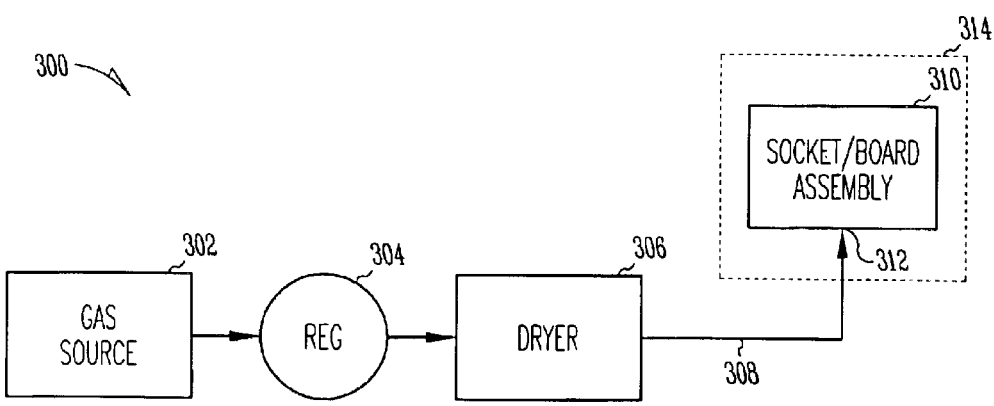
FIG. 3 is functional block diagram of a system for reducing contact-pin temperature in accordance with an embodiment of the present invention.

FIG. 3 is functional block diagram of a system 300 for reducing contact-pin temperature in accordance with an embodiment of the present invention. System 300 may include a gas source 302 to provide gas to socket-board-package assembly 310. The gas may be used to cool contacts and package pins of assembly 310. Assembly 310 may form part of an electronic system 314.

An "electronic system" is broadly defined herein as any product or entity comprising an electronic assembly. Examples of electronic systems 314 include computers (e.g., desktop, laptop, hand-held, server, server system, server farm, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, digital video disc players, etc.), and the like.

Assembly 310 may allow higher current electronic systems 314, including microprocessors and processing systems, to operate at higher data rates. Socket-board-package assembly 100 (FIG. 1) may be suitable for use as socket-board-package assembly 300, although other socket-board-package assemblies may also be suitable. Socket-board-package assembly 300 may have one or more gas inlets 312 to receive gas through gas tube 308 from gas source 302.

Gas source 302 may comprise a gas pump, a gas compressor, a fan, or other forced-gas source that provides a forced gas through gas tube 308. When socket-board-package assembly 300 is part of a server or server system, gas source 302 may be an air supply or inert gas source for a server farm. In some embodiments, system 300 may include a regulator 304 to regulate an output pressure of gas provided to assembly 310. In some embodiments, system 300 may also include a dryer 306 to help remove moisture from the gas provided by gas source 302, allowing relatively dry gas to be provided to assembly 310.

In some embodiments, gas source 302 may comprise an air pump. In some embodiments, the gas provided by gas source 302 may be close to or at an ambient temperature, while in other embodiments, the gas provided by gas source 302 may be cooled to a lower temperature by a cooling device (not illustrated).

Although system 300 is illustrated as having several separate functional elements, one or more of the functional elements may be combined and may be implemented by combinations of elements. For example, gas source 302, regulator 304 and dryer 306 may be combined as one functional element.

Figure 4:
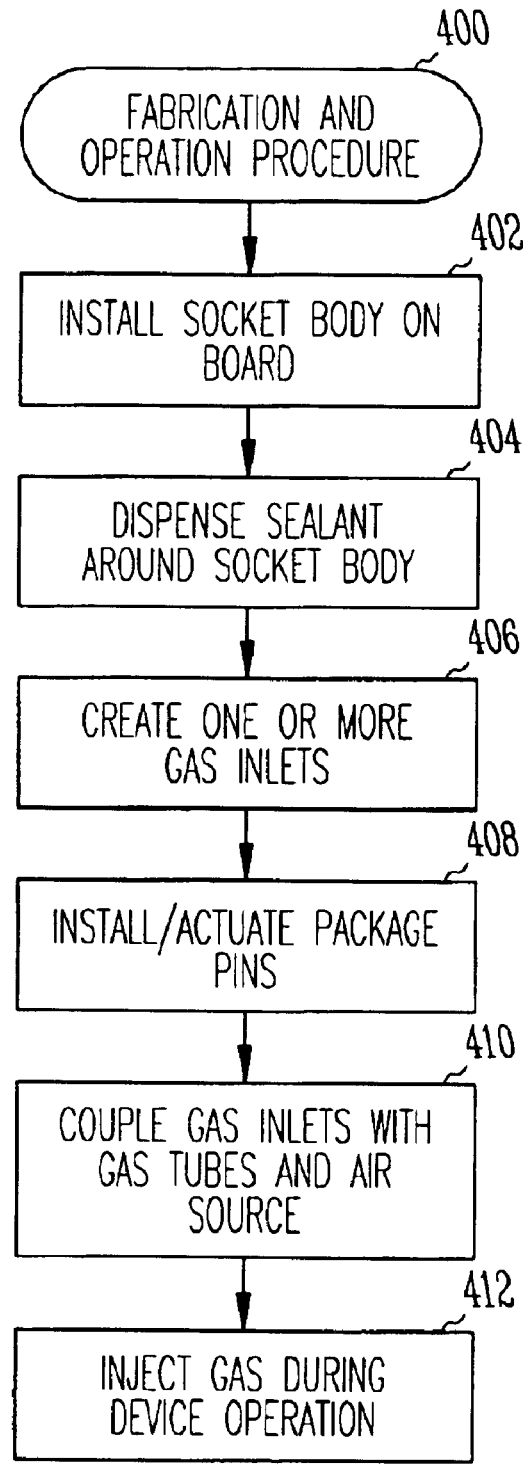
FIG. 4 is a flow chart of a fabrication and operation procedure in accordance with an embodiment of the present invention.

FIG. 4 is a flow chart of a fabrication and operation procedure 400 in accordance with an embodiment of the present invention. Procedure 400 may be used to fabricate and/or operate a socket-board-package assembly, such as assembly 100 (FIG. 1) within a system, such as system 300 (FIG. 3), although other assemblies and systems may also be suitable. Procedure 400 may reduce the contact-pin temperature of high-current semiconductor packages allowing microprocessors and processing systems to operate at higher data rates, for example. Procedure 400 may also increase the reliability of high-current semiconductor packages and reduce the amount of contact-pin oxidation.

In 402, a socket body may be surface-mounted on a circuit board. One of many surface-mounting techniques may be used, including techniques using solder balls in a ball-grid array to couple contacts within the socket body with conductive paths on the circuit board.

In 404, a sealant may be dispensed around the perimeter of the socket body. The sealant may seal the region, such as region 122 (FIG. 1), between the circuit board and socket body.

In 406, a gas inlet may be created to allow gas into the region between the circuit board and socket body. The gas inlet may be created in the circuit board, the sealant and/or the socket body. Examples of locations for gas inlets are illustrated in FIG. 1 as gas inlets 120. In embodiments, when the gas inlet is created in the circuit board or socket body, 406 may be performed prior to 402. When a gas inlet is created in the sealant, 406 may be performed concurrently with or as part of 404.

In 408, a package substrate with package pins may be installed on the socket body. The package pins, such as pins 108 (FIG. 1) may be actuated with an actuator, such as actuator 104 (FIG. 1), to couple the package pins with contacts, such as contacts 110 (FIG. 1).

In 410, the one or more gas inlets created in 406 may be coupled with one or more gas tubes, which may be connected to a gas source, such as gas source 302 (FIG. 3).

In 412, gas from the gas source is forced through the gas tubes to reduce the temperature of contacts and package pins of an assembly, such as assembly 100 (FIG. 1). The gas may be forced into the region between the circuit board and the socket body, and because the sealant is around the perimeter of the socket body, the forced gas may flow through contact-cavities (e.g., cavities 112 (FIG. 1)) to remove heat from the contacts and the associated package pins. The contact-pin temperature may be reduced allowing power pins, for example, to carry significantly more current. 412 may be performed during operation of the one or more semiconductor devices and systems that are part of the package substrate.

Although the individual operations of procedure 400 are illustrated and described as separate operations, one or more of the individual operations may be performed concurrently, and nothing requires that the operations be performed in the order illustrated.

Thus, an improved socket-board-package assembly and methods for cooling contact pins have been described. In some embodiments, a socket-board-package assembly and method may reduce the temperature of contacts and associated package pins. In some embodiments, the socket-board-package assembly and methods of the present invention are suitable for higher current consumption semiconductor packages that include microprocessors and processing systems, allowing operations at higher data rates. In embodiments, the socket-board-package assembly and methods of the present invention may result in improved reliability for package substrates, and they may also provide reduced contact pin oxidation.

The foregoing description of specific embodiments reveals the general nature of the inventive subject matter sufficiently that others can, by applying current knowledge, readily modify and/or adapt it for various applications without departing from the generic concept. Therefore, such adaptations and modifications are within the meaning and range of equivalents of the disclosed embodiments. The phraseology or terminology employed herein is for the purpose of description and not of limitation. Accordingly, the inventive subject matter embraces all such alternatives, modifications, equivalents and variations as fall within the spirit and scope of the appended claims.

What is claimed is:

1. An apparatus comprising:
    a socket body having cavities therein to contain contacts;
    a sealant to at least in part seal the socket body with a circuit board; and
    a gas inlet for forced gas to flow through the cavities and directly over the contacts to cool the contacts.

2. The apparatus of claim 1 wherein the gas inlet is located in the circuit board, and wherein the gas inlet receives a directional flow of the forced gas.

3. The apparatus of claim 1 wherein the sealant helps prevent the gas from escaping from between the socket body with the circuit board and helps the forced gas to flow through the cavities directly over the contacts.

4. The apparatus of claim 3 wherein the forced gas is further to cool package pins of a semiconductor package substrate, the gas to flow out of a gap between the package substrate and the socket body.

5. An apparatus comprising:
    a socket body having cavities therein to contain contacts;
    a sealant to at least in part seal the socket body with a circuit board; and
    a gas inlet to allow forced gas to flow through the cavities and cool the contacts,
    wherein the gas inlet is located in the sealant.

6. An apparatus comprising:
    a socket body having cavities therein to contain contacts;
    a sealant to at least in part seal the socket body with a circuit board; and
    a gas inlet to allow forced gas to flow through the cavities and cool the contacts,
    wherein the gas inlet is located within the socket body.

7. An apparatus comprising:
    a socket body having cavities therein to contain contacts;
    a sealant to at least in part seal the socket body with a circuit board;
    a gas inlet to allow forced gas to flow through the cavities and cool the contacts; and
    a semiconductor package substrate having package pins coupled with the contacts,
    the forced gas to further cool the package pins and to flow out of a gap between the package substrate and the socket body,
    wherein some of the package pins are power pins, and
    wherein the gas inlet is located at a location in the circuit board selected to provide the forced gas to contacts that are coupled with the power pins of the package substrate.

8. The apparatus of claim 7 wherein the semiconductor package substrate includes a processing system, and wherein the power pins and associated contacts are to have at least 300 milliamps of current flowing therethrough during operation of the system, the forced gas to further cool the power pins.

9. The apparatus of claim 8 wherein the contacts and socket body are surface-mounted to the circuit board with solder balls in a ball-grid array.

10. The apparatus of claim 9 further comprising:
    a pump to generate the forced gas; and
    a gas tube to couple the pump to the gas inlet.

11. A system comprising:
    a gas source to generate forced gas; and
    a socket-board-package assembly having at least one gas inlet to receive the forced gas, the forced gas to reduce a temperature of contacts of the assembly, wherein the assembly comprises:
a socket body having cavities therethrough, the cavities to contain the contacts;
a sealant to at least in part seal the socket body with a circuit board; and
a gas inlet to allow the forced gas to flow through the cavities to cool the contacts and package pins of a semiconductor package substrate, the forced gas to flow out of a gap between the package substrate and the socket body.

12. The system of claim 11 wherein the at least one gas inlet is located in one of either the circuit board beneath the socket body, the sealant, or the socket body.

13. The system of claim 11 wherein at least some of the package pins are power pins, and
wherein a location of the gas inlet in the circuit board is selected to provide the forced gas to contacts that are coupled with the power pins of the package substrate.

14. A system comprising:
a gas source to generate forced gas; and
a socket-board-package assembly having at least one gas inlet to receive the forced gas, the forced gas to reduce a temperature of contacts of the assembly,
wherein the system is part of one of a plurality of server systems that is part of a server farm, wherein the gas source comprises a forced air supply provided by the server farm, and wherein the system further comprises:
a regulator to couple between the air supply and the socket-board-package assembly to provide a regulated air flow to the assembly through an air tube.

15. The system of claim 14 further comprising a dryer coupled between the air supply and assembly to remove moisture from the air flow.

16. A method comprising:
dispensing sealant on a socket body to at least in part seal the socket body with a circuit board generating at least a partially sealed region; and
providing a gas inlet into the at least partially sealed region between the circuit board and socket body, the at least partially sealed region to permit forced gas to flow through cavities of the socket body to directly cool contacts located therein by directly flowing over the contacts.

17. The method of claim, 16 wherein the forced gas further directly cools package pins of a semiconductor package substrate, the forced gas to enter via the gas inlet and the forced gas to flow out of a gap between the package substrate and the socket body.

18. The method of claim 16 wherein the gas inlet is provided in one of the circuit board beneath the socket body, the sealant, or the socket body.

19. A method comprising:
dispensing sealant on a socket body to at least in part seal the socket body with a circuit board; and
providing a gas inlet into a region between the circuit board and socket body, to permit forced gas to flow through cavities of the socket body to cool the contacts located therein,
wherein the gas inlet is provided in one of the circuit board beneath the socket body, the sealant, or the socket body,
wherein at least some of the package pins are power pins, and wherein the method further comprises:
selecting a location for the gas inlet in the circuit board to provide the forced gas to cool contacts that are coupled with the power pins of the package substrate.

20. A method comprising:
forcing gas to flow through an at least partially sealed region having cavities of a socket body to directly cool contacts located therein.

21. The method recited in claim 20 wherein package pins of a semiconductor package substrate are also located within the cavities, the method further comprising:
forcing the gas to flow in through a gas inlet and to flow out through a gap between the package substrate and the socket body.

22. A method comprising:
forcing gas to flow through cavities of a socket body to cool contacts located therein,
wherein package sins of a semiconductor package substrate are also located within the cavities, the method further comprising:
forcing the gas to flow out of a gap between the package substrate and the socket body,
wherein at least some of the package pins are power pins coupled to the contacts, and
wherein the method further comprises: forcing gas through a gas inlet in at least one of a circuit board beneath the socket body, a sealant between the socket body and the circuit board, or the socket body, and to flow through the cavities.

* * * * *

UNITED STATES PATENT AND TRADEMARK OFFICE
CERTIFICATE OF CORRECTION

PATENT NO. : 6,840,794 B2
DATED : January 11, 2005
INVENTOR(S) : Chiu

It is certified that error appears in the above-identified patent and that said Letters Patent is hereby corrected as shown below:

Column 7,
Line 46, delete "claim, 16" and insert -- claim 16 --, therefor.

Column 8,
Line 35, delete "sins" and insert -- pins --, therefor.

Signed and Sealed this

Twenty-third Day of August, 2005

JON W. DUDAS
*Director of the United States Patent and Trademark Office*